United States Patent
Curatola

(10) Patent No.: US 10,636,899 B2
(45) Date of Patent: Apr. 28, 2020

(54) HIGH ELECTRON MOBILITY TRANSISTOR WITH GRADED BACK-BARRIER REGION

(71) Applicant: Infineon Technologies Austria AG, Villach (AT)

(72) Inventor: Gilberto Curatola, Villach (AT)

(73) Assignee: Infineon Technologies Austria AG, Villach (AT)

( * ) Notice: Subject to any disclaimer, the term of this patent is extended or adjusted under 35 U.S.C. 154(b) by 498 days.

(21) Appl. No.: 15/352,115

(22) Filed: Nov. 15, 2016

(65) Prior Publication Data

US 2018/0138304 A1   May 17, 2018

(51) Int. Cl.
*H01L 29/778* (2006.01)
*H01L 29/20* (2006.01)
(Continued)

(52) U.S. Cl.
CPC ...... *H01L 29/7784* (2013.01); *H01L 29/2003* (2013.01); *H01L 29/205* (2013.01);
(Continued)

(58) Field of Classification Search
CPC ..... H01L 29/7782–7786; H01L 29/205; H01L 29/66462
See application file for complete search history.

(56) References Cited

U.S. PATENT DOCUMENTS

| | | |
|---|---|---|
| 6,531,718 B2 | 3/2003 | Inoue et al. |
| 6,617,060 B2 | 9/2003 | Weeks, Jr. et al. |

(Continued)

FOREIGN PATENT DOCUMENTS

| | | |
|---|---|---|
| CN | 105047708 A | 11/2015 |
| EP | 2869347 A1 | 5/2015 |
| WO | 2013008461 A1 | 1/2013 |

OTHER PUBLICATIONS

Micovic et al. "GaN double heterojunction Field effect transistor for microwave and millimeterwave power applications" in IEDM Technology Digest 2004, pp. 807-810. Published by IEEE in 2004. (Year: 2004).*

(Continued)

*Primary Examiner* — Tuan A Hoang
(74) *Attorney, Agent, or Firm* — Murphy, Bilak & Homiller, PLLC

(57) ABSTRACT

A semiconductor device includes a type III-V semiconductor body having a main surface and a rear surface opposite the main surface. A barrier region is disposed beneath the main surface. A buffer region is disposed beneath the barrier region. A first two-dimensional charge carrier gas region forms near an interface between the barrier region and the buffer region. A second two-dimensional charge carrier gas region forms near an interface between the buffer region and the first back-barrier region. A third two-dimensional charge carrier gas region forms near an interface between the first back-barrier region and the second back-barrier region. Both of the second and third two-dimensional charge carrier gas regions have an opposite carrier type as the first two-dimensional charge carrier gas region. The third two-dimensional charge carrier gas region is more densely populated with charge carriers than the second two-dimensional charge carrier gas region.

16 Claims, 2 Drawing Sheets

(51) Int. Cl.
  *H01L 29/205* (2006.01)
  *H01L 29/66* (2006.01)
  *H01L 29/10* (2006.01)

(52) U.S. Cl.
  CPC .... *H01L 29/66462* (2013.01); *H01L 29/7783* (2013.01); *H01L 29/1066* (2013.01)

(56) References Cited

U.S. PATENT DOCUMENTS

| | | | |
|---|---|---|---|
| 6,649,287 | B2 | 11/2003 | Weeks, Jr. et al. |
| 7,098,490 | B2 | 8/2006 | Micovic et al. |
| 7,339,205 | B2 | 3/2008 | Piner et al. |
| 8,159,004 | B2 | 4/2012 | Sato et al. |
| 8,344,356 | B2 | 1/2013 | Sakamoto et al. |
| 8,659,030 | B2 | 2/2014 | Briere |
| 8,664,693 | B2 | 3/2014 | Nam et al. |
| 8,686,473 | B1 | 4/2014 | Micovic et al. |
| 8,748,244 | B1 | 6/2014 | Corrion et al. |
| 8,796,738 | B2 | 8/2014 | Briere |
| 8,853,666 | B2 * | 10/2014 | Inoue .......... H01L 29/155 257/12 |
| 8,860,091 | B2 | 10/2014 | Brown et al. |
| 9,029,868 | B2 | 5/2015 | Kotani et al. |
| 9,165,766 | B2 | 10/2015 | Keller et al. |
| 9,257,548 | B2 * | 2/2016 | Takado .......... H01L 21/02579 |
| 9,397,167 | B2 | 7/2016 | Yoshida et al. |
| 2007/0056506 | A1 | 3/2007 | Bridger et al. |
| 2009/0045438 | A1 * | 2/2009 | Inoue .......... H01L 29/155 257/192 |
| 2011/0073911 | A1 * | 3/2011 | Sato .......... H01L 29/107 257/194 |
| 2011/0215378 | A1 * | 9/2011 | Hwang .......... H01L 29/7786 257/194 |
| 2012/0153351 | A1 | 6/2012 | Chandolu et al. |
| 2012/0223365 | A1 | 9/2012 | Briere |
| 2015/0115327 | A1 * | 4/2015 | Briere .......... H01L 29/778 257/194 |
| 2015/0129889 | A1 * | 5/2015 | Nakata .......... H01L 29/7784 257/76 |
| 2018/0158909 | A1 * | 6/2018 | Mishra .......... H01L 29/408 |

OTHER PUBLICATIONS

Inoue, Takashi et al., "Polarization Engineering on Buffer Layer in GaN-Based Heterojunction FETs", IEEE Transactions on Electron Devices, vol. 55, No. 2, Feb. 2008, 483-488.

Jarndal, Anwar, "Large-Scale Modeling of GaN Devices fro Designing High Power Amplifiers of Next Generation Wireless Communication Systems", Chapter 10 of Mobil and Wireless Communications Network Layer and Circuit Level Design, 2010, 1-30.

Lin, Chung-Han, et al., "Strain and Temperature Dependence of Defect Formation at AlGaN/GaN High-Electron-Mobility Transistors on a Nanometer Scale", IEEE Transactions on Electron Devices 59, 2012, 2667-2674.

Peng, Enchao, et al., "Bipolar characteristics of AlGaN/AlN/GaN/AlGaN double heterojunction structure with AlGaN as buffer layer", Journal of Alloys and Compounds, vol. 576, 2013, 2013, 48-53.

Shen, L, et al., "High-Power Polaration-Engineered GaN/AlGaN/GaN HEMTs Without Surface Passivation", IEEE Electron Device Letters 25, 2004, 7-9.

* cited by examiner

HIGH ELECTRON MOBILITY TRANSISTOR WITH GRADED BACK-BARRIER REGION

TECHNICAL FIELD

The instant application generally relates to high electron mobility transistors, and more particularly relates to substrate design for high electron mobility transistors.

BACKGROUND

Semiconductor transistors, in particular field-effect controlled switching devices such as a MISFET (Metal Insulator Semiconductor Field Effect Transistor), in the following also referred to as MOSFET (Metal Oxide Semiconductor Field Effect Transistor) and a HEMT (high-electron-mobility Field Effect Transistor) also known as heterostructure FET (HFET) and modulation-doped FET (MODFET) are used in a variety of applications. An HEMT is a transistor with a junction between two materials having different band gaps, such as GaN and AlGaN. In a GaN/AlGaN based HEMT, a two-dimensional electron gas (2DEG) arises near the interface between the AlGaN barrier layer and the GaN buffer layer. In an HEMT, the 2DEG forms the channel of the device. Similar principles may be utilized to select buffer and barrier layers that form a two-dimensional hole gas (2DHG) as the channel of the device. A 2DEG or a 2DHG is generally referred to as a two-dimensional carrier gas. Without further measures, the heterojunction configuration leads to a self-conducting, i.e., normally-on, transistor. Measures must be taken to prevent the channel region of an HEMT from being in a conductive state in the absence of a positive gate voltage.

Due to the high electron mobility of the two-dimensional carrier gas in the heterojunction configuration, HEMTs offer high conduction and low losses in comparison to many conventional semiconductor transistor designs. These advantageous conduction characteristics make HEMTs desirable in applications including, but not limited to, use as switches in power supplies and power converters, electric cars, air-conditioners, and in consumer electronics, for example. However, normally-on HEMTs have limited applicability in these applications because these devices must be accompanied by circuitry that can generate the negative voltages necessary to turn the device off. Such circuitry adds cost and complexity to the design. For this reason, it is typically desirable to include features in an HEMT that modify the intrinsic normally-on configuration and provide a device with a normally-off configuration (i.e., a positive threshold voltage).

One technique for providing a normally-off HEMT involves configuring the gate structure to locally disrupt the intrinsic conductive state of the channel region. For example, a relatively thick (typically 100 nm or greater) p-type doped GaN material can be formed under the gate electrode of an HEMT. This thick p-type GaN layer depletes the inversion layer under the gate structure, shifting the threshold voltage of the device to positive values. The p-type GaN layer must be thick enough to create a vertical field which depletes and populates the naturally occurring inversion channel underlying the barrier layer, typically a layer of AlGaN. The vertical field generated by a voltage applied to the gate electrode allows for on and off modulation of the inversion layer.

Designers are constantly seeking ways to improve the device parameters of HEMTs so these devices offer better switching performance with lower losses. Notable device parameters that designers seek to improve include leakage current, maximum gate voltage and transconductance.

SUMMARY

A semiconductor device is disclosed. According to an embodiment, the semiconductor device includes a type III-V semiconductor body having a main surface and a rear surface opposite the main surface. A barrier region is disposed beneath the main surface. A buffer region is disposed beneath the barrier region. The buffer region has a different band gap than the barrier region so as to form a first two-dimensional charge carrier gas region near an interface between the barrier region and the buffer region. A first back-barrier region is disposed beneath the buffer region. The first back-barrier region has a different band gap than the buffer region so as to form a second two-dimensional charge carrier gas region near an interface between the buffer region and the first back-barrier region. A second back-barrier region is disposed beneath the first back-barrier region. The second back-barrier region has a different band gap than the first back-barrier region so as to form a third two-dimensional charge carrier gas region near an interface between the first back-barrier region and the second back-barrier region. Both of the second and third two-dimensional charge carrier gas regions have an opposite carrier type as the first two-dimensional charge carrier gas region. The third two-dimensional charge carrier gas region is more densely populated with charge carriers than the second two-dimensional charge carrier gas region.

A transistor is disclosed. According to an embodiment, the transistor includes a type III-V semiconductor body having a main surface and a rear surface opposite the main surface. A barrier region is disposed beneath the main surface. A buffer region is disposed directly beneath the barrier region. The buffer region has a different band gap than the barrier region so as to form a first two-dimensional charge carrier gas region near an interface between the barrier region and the buffer region. Gate, source and drain electrodes are disposed on the main surface. The source and drain electrodes are in ohmic contact with the first two-dimensional charge carrier gas region. The gate electrode is configured to control a conductive state of the first two-dimensional charge carrier gas region between the source and drain electrodes. A first back-barrier region is disposed directly beneath the buffer region. A second back-barrier region is disposed directly beneath the first back-barrier region. The first back-barrier region and the second back-barrier region each include a type III-V semiconductor metal alloy. A metal concentration of the second back-barrier region is higher than in the first back-barrier region.

A method of forming a semiconductor device is disclosed. According to an embodiment of the method, a type III-V semiconductor body having a main surface and a rear surface opposite the main surface is formed. A barrier region is formed in the semiconductor body beneath a main surface of the type III-V semiconductor body. A buffer region is formed in the semiconductor body beneath the barrier region. The buffer region has a different band gap than the barrier region so as to form a first two-dimensional charge carrier gas region near an interface between the barrier region and the buffer region. A first back-barrier region is formed in the semiconductor body beneath the buffer region. The first back-barrier region has a different band gap than the buffer region so as to form a second two-dimensional charge carrier gas region near an interface between the buffer region and the first back-barrier region. A second back-barrier region is formed in the semiconductor body beneath the first back-barrier region. The second back-barrier region has a different band gap than the first back-barrier region so as to form a third two-dimensional charge carrier gas region near an interface between the first back-barrier region and the second back-barrier region. Both of the second and third two-dimensional charge carrier gas regions have an opposite carrier type as the first two-dimensional charge carrier gas region. Forming the type III-V semiconductor body includes selecting parameters of the buffer region, the first back-barrier region, and the second back-barrier region such that the third two-dimensional charge carrier gas region is more densely populated with charge carriers than the second two-dimensional charge carrier gas region.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
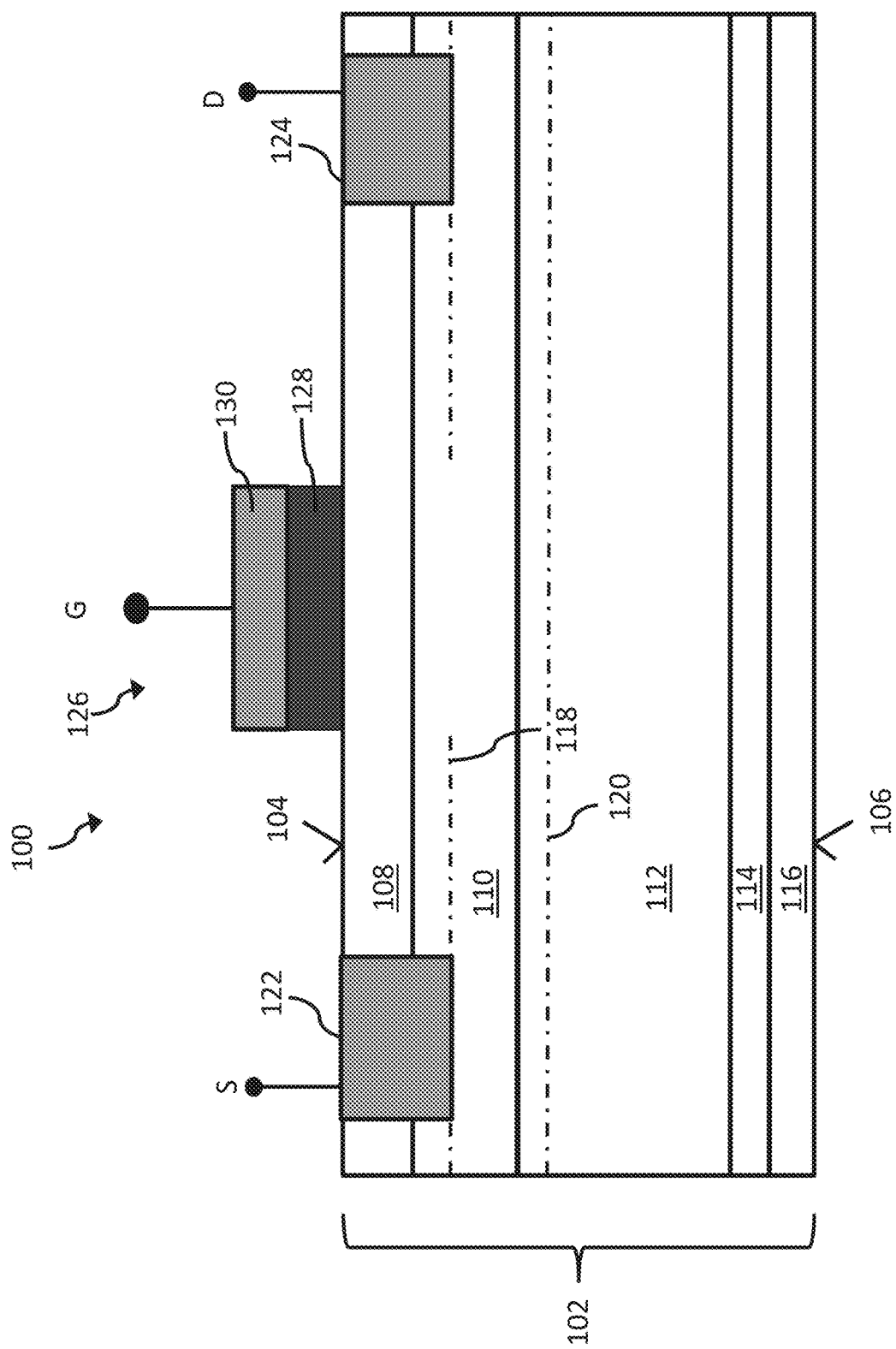
FIG. 1 illustrates a high-electron-mobility field effect transistor with a uniform back-barrier region, according to an embodiment.

According to embodiments described herein, an HEMT with a graded back-barrier design is disclosed. The channel of the HEMT device is formed by a heterojunction between a barrier region and a buffer region. The graded back-barrier region is disposed beneath the buffer region on an opposite side of the buffer region as the barrier region. The graded back-barrier region includes two or more layers. A first layer of the graded back-barrier region adjoins the buffer region, and a second layer of the graded back-barrier region adjoins the first layer of the graded back-barrier region. According to a particular embodiment, the barrier region is a region of aluminium gallium nitride (AlGaN), the buffer region is a region of gallium nitride (GaN), the first layer of the graded back-barrier region is a layer of AlGaN, and the second layer of the graded back-barrier region is a layer of AlGaN with a higher aluminium content than the first layer. Due to the difference in bandgap between the buffer and barrier region, a two-dimensional electron gas (2DEG) forms at the interface between the barrier region and a buffer region. This 2DEG forms the channel of the device. Due to the difference in bandgap between the buffer region and the first layer and between the first layer and the second layer, parasitic two-dimensional hole-gas regions form near the respective interfaces of these regions.

The presence of the graded back-barrier region beneath the channel of the device provides numerous performance benefits including increased carrier confinement in the channel of the device, reduced threshold voltage and reduced off-state source to drain leakage of the device. Moreover, these benefits are achieved without the drawbacks associated with a uniform back-barrier region design. In a uniform back-barrier region design, a back-barrier region with the same bandgap throughout the back-barrier region directly adjoins the buffer region. This configuration results in a parasitic two-dimensional charge carrier gas (e.g., a 2DHG) that arises at the interface of the back-barrier region and the buffer region. This parasitic two-dimensional charge carrier gas channel region can detrimentally impact the long and short-term reliability of the device. The graded back-barrier design disclosed herein can be tailored such that the two-dimensional hole-gas region between the buffer region and the first layer is at least partially depleted of carriers and the vast majority of free carriers in the back-barrier region are disposed in the two-dimensional charge carrier region between the first layer and the second layer of the back-barrier. Thus, the impact of the parasitic two-dimensional charge carrier gas over the channel of the device is substantially mitigated, as the parasitic two-dimensional charge carrier gas that is populated with carriers is much further away from the channel of the device. Meanwhile, the beneficial effects of the back-barrier (in comparison to a device that is devoid of a back-barrier) including positive shift in threshold voltage and reduced leakage current are still realized.

Referring to FIG. 1, a semiconductor device 100 is depicted, according to an embodiment. The semiconductor device 100 is configured as a normally-off HEMT. The semiconductor device 100 includes a heterostructure body 102. The heterostructure body 102 includes a main surface 104 and a rear surface 106 opposite the main surface 104. A barrier region 108 directly adjoins the main surface 104 and extends into the heterostructure body 102. A buffer region 110 is disposed beneath the barrier region 108. A back-barrier region 112 is disposed beneath the buffer region 110. A lattice transition layer 114 is disposed beneath the back-barrier region 112. A base substrate 116 is disposed beneath the lattice transition layer 114 and directly adjoins the rear surface 106.

According to an embodiment, the back-barrier region 112 is a region of AlGaN, the buffer region 110 is a region of GaN, and the back-barrier region 112 is a region of AlGaN. The difference in band gap and the presence of the polarization charges between between the GaN buffer region 110 and the AlGaN barrier region 108 causes a first two-dimensional charge carrier gas region 118 to intrinsically arise near an interface between the buffer region 110 and the barrier region 108. Likewise, the difference in band gap between the AlGaN back-barrier region 112 and the buffer region 110 causes a second two-dimensional charge carrier gas region 120 to intrinsically arise near the interface between the AlGaN back-barrier region 112 and the buffer region 110. With this material selection (i.e., the AlGaN/GaN/AlGaN barrier/buffer/back-barrier structure), the first two-dimensional charge carrier gas region 118 includes a two-dimensional electron gas (2DEG) and the second two-dimensional charge carrier gas region 120 includes a two-dimensional hole gas (2DHG). That is, the first two-dimensional charge carrier gas region 118 includes carriers of opposite conductivity type as the second two-dimensional charge carrier gas region 120.

According to an embodiment, the heterostructure body 102 is formed using an epitaxial growth process. According to this process, the base substrate 116 is first provided. The base substrate 116 can include any material that is suitable for epitaxial growth thereon. Exemplary materials for the base substrate 116 include silicon and carbon. The base substrate 116 can be provided from a bulk semiconductor substrate or alternatively can be formed using an epitaxy process. After providing the base substrate 116 an AlN nucleation layer (not shown) and the lattice transition layer 114 is epitaxially grown on the base substrate 116. The back-barrier region 112, buffer region 110 and barrier region 108 are then epitaxially grown on the lattice transition layer 114. The aluminum content of the back-barrier region 112 is constant throughout the back-barrier region 112, and can be anywhere between two and ten percent.

The semiconductor device 100 includes source and drain electrodes 122, 124 on the main surface 104 of the heterostructure body 102. The source and drain electrodes 122, 124 are formed from an electrically conductive material, such as a metal or highly doped semiconductor. According to one embodiment, the source and drain electrodes 122, 124 extend completely through the barrier region 108 and physically contact the first two-dimensional charge carrier gas region 118. However, physical contact is not necessary and the source and drain electrodes 122, 124 may alternatively be spaced apart from the channel but nonetheless be in ohmic connection with the channel of the device.

The semiconductor device 100 further includes a gate structure 126 that is formed on the main surface 104 of the heterostructure body 102. The gate structure 126 includes a doped semiconductor region 128 that is formed on the main surface 104. An electrically conductive gate electrode 130 is provided on the doped semiconductor region 128. Optionally, the gate structure 126 may be provided in a recess formed in the heterostructure body 102 such that the doped semiconductor region 120 is spaced closer to the first two-dimensional charge carrier gas region 118 than the main surface 104 of the heterostructure body 102. According to an embodiment, the doped semiconductor region 128 is formed from a p-type semiconductor nitride material (e.g., p-type GaN).

The semiconductor device 100 is configured to control the current between the source and drain electrodes 122, 124 by appropriately biasing the gate electrode 130. The 2DEG that is present in the first two-dimensional charge carrier gas region 118 provides a conductive connection between the source and drain electrodes 122, 124. The gate can be biased to locally influence the 2DEG and consequently complete or disrupt this conductive connection. The thickness and doping concentration of the doped semiconductor region 120 is controlled such that, without any external bias applied to the gate electrode 130, the 2DEG is locally depleted in a region beneath the gate structure 126. That is, the parameters of the doped semiconductor region are controlled to disrupt the conductive connection between the source and drain electrodes 122, 124 in the absence of a gate bias and therefore provide a normally-off HEMT device. The gate structure 126 is configured to turn the device ON with a sufficient voltage applied to the gate electrode 130 that removes the depleted region of the first two-dimensional charge carrier gas region 118 underneath the gate structure 126 118. As a result, the first two-dimensional charge carrier gas region 118 forms a conductive connection between the source and drain contacts 114, 116.

The back-barrier region 112 is positioned underneath the 2DEG and is configured to improve the overall performance of the semiconductor device 100. Specifically, the presence of the back-barrier region 112 underneath the 2DEG (i.e., the first two-dimensional charge carrier gas region 118) causes more electrons to be confined within the 2DEG. This improves the off-state source-to-drain leakage current and makes the threshold voltage of the device more positive. In addition, the provision of a higher bandgap material (e.g., AlGaN instead of GaN) underneath the buffer region 110 increases the energy barrier in a vertical direction of the device and consequently improves (i.e., reduces) the vertical leakage of the device.

However, the inclusion of a back-barrier region 112 with uniform bandgap properties (e.g., an AlGaN layer with a constant aluminum content throughout the layer) in the device has certain drawbacks. Because the back-barrier region 112 has a different band gap as the buffer region 110, a parasitic two-dimensional hole-gas (2DHG) arises at the second two-dimensional charge carrier gas region 120. This parasitic 2DHG provides an energetically favorable level in which holes injected from the doped semiconductor region 128 or generated via generation-recombination mechanisms can accumulate. The presence of these holes in the 2DHG can have a detrimental impact on the performance on the device. First of all, electron-hole recombination effects are greatly delayed since electrons lie in the 2DEG channel and holes lie in the 2DHG channel. Moreover, the 2DHG is electrically floating. That is, the 2DHG is not in ohmic contact with any conductive contact structure and thus cannot be held at a fixed potential. As a result, during operation of the semiconductor device 100, the opposite charges of the 2DEG and 2DHG form an electric field. If this electric field is sufficiently large, the reliability of the device (i.e., ability to maintain ON or OFF state) can be substantially compromised. This phenomenon can be mitigated by making the buffer region 110 sufficiently thick (e.g., 100 nm or more) so that the above described electric field is weakened. However, increasing the thickness of the buffer region 110 results decreases the benefits with respect to off-state source-to-drain leakage and threshold voltage.

For these reasons, the thickness of the buffer region 110 should remain between 100 nm and 200 nm. If the buffer region 110 is made any thinner than 100 nm, reliability concerns predominate. If the buffer region 110 is made any thicker than 100 nm, e.g., 200 nm, the benefits with respect to leakage current and threshold voltage are effective lost.

Figure 2:
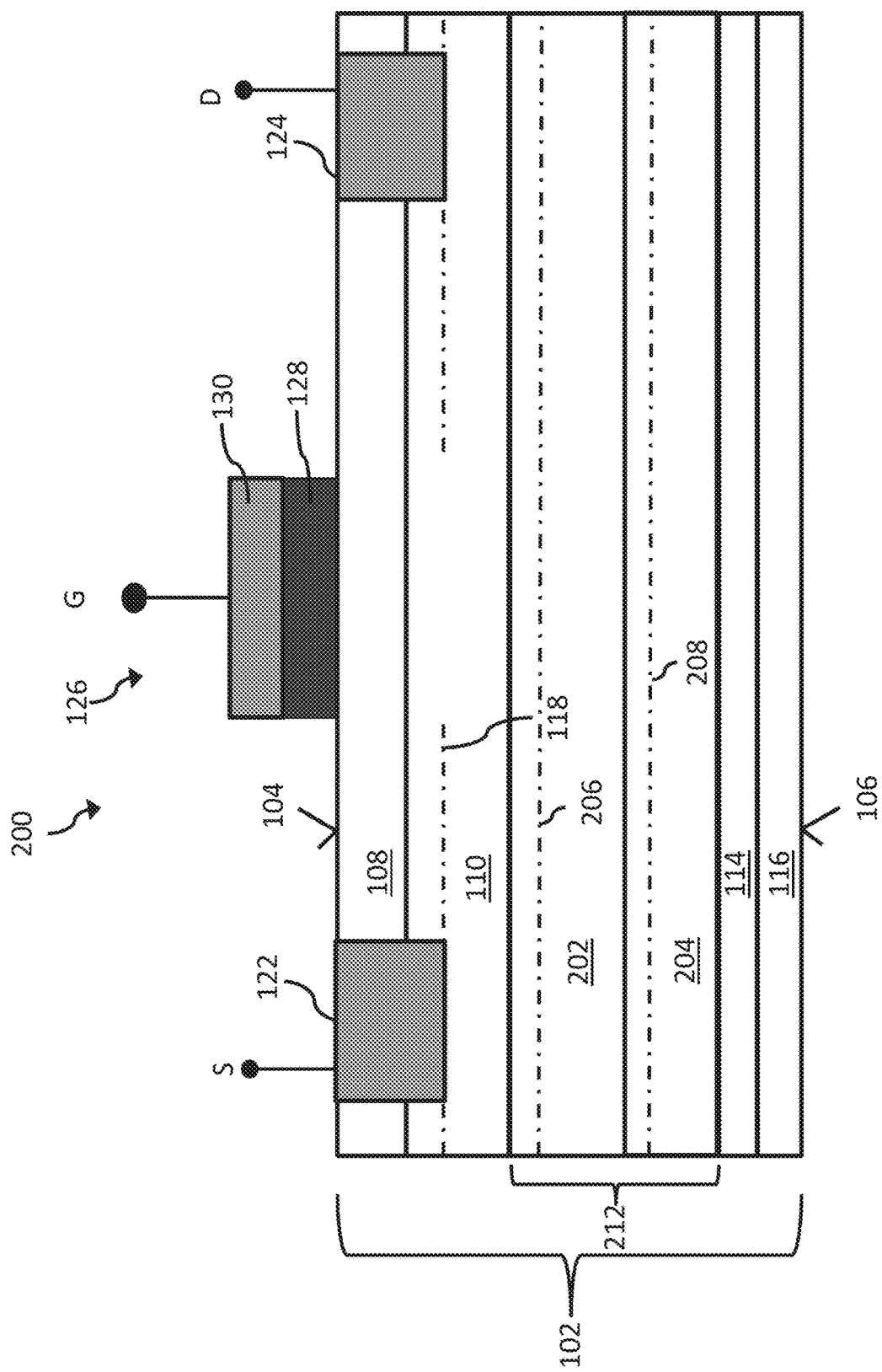
FIG. 2 illustrates a high-electron-mobility field effect transistor with a graded back-barrier region, according to an embodiment.

Referring to FIG. 2, a semiconductor device 200 is depicted, according to an embodiment. The semiconductor device 200 of FIG. 2 has an identical configuration as the semiconductor device 100 of FIG. 1 with the exception of the configuration of the back-barrier. Instead of having a back-barrier region 112 with uniform electrical properties, the back-barrier region 212 of the semiconductor device 200 of FIG. 2 with non-uniform electrical properties.

According to an embodiment, the back-barrier region 212 includes a first back-barrier region 202 beneath the buffer region 110, and a second back-barrier region 204 beneath the first back-barrier region 202. The first and second back-barrier regions 204, 206 are each regions of type III-V semiconductors having different bandgaps from one another. Moreover, the first back-barrier region 202 has a different bandgap than the buffer region 110. As a result, a second two-dimensional charge carrier gas region 206 forms near an interface between the buffer region 110 and the first back-barrier region 202. Further, the second back-barrier region 204 has a different bandgap than the first back-barrier region 202. As a result, a third two-dimensional charge carrier gas region 208 forms near an interface between the first back-barrier region 202 and the second back-barrier region 204.

Using the AlGaN/GaN barrier/buffer configuration as an example, the first back-barrier region 202 can be a first layer of AlGaN and the second back-barrier region 204 can be a second layer of AlGaN wherein the metal content (i.e., the aluminum content) of the second back-barrier region 204 is higher than in the first back-barrier region 202. In this material example, the second and third two-dimensional charge carrier gas regions form as 2DHG regions.

In the above described AlGaN/GaN/AlGaN structure with a graded back barrier region 212, the inventors have discovered that the negative effects of the parasitic 2DHG described with reference to FIG. 1 can be suppressed by appropriately tailoring the device parameters. Examples these device parameters include a thickness of the buffer region 110, thickness and metal concentration of the first back-barrier region 202, and metal concentration of the second back-barrier region 204. When the thicknesses and metal content (i.e., mole fractions) of these regions is properly chosen, the difference in the metal content in the two back-barrier layers together with the presence of the polarization charges will create an electric field that will push away parasitic holes from the electron inversion layer. Moreover, as the thickness of the buffer region 110 is increasingly reduced, the second two-dimensional charge carrier gas region 120 is very efficiently depleted of carriers. Therefore, only the third two-dimensional charge carrier gas region 208 remains populated with carriers.

Whereas the thickness of the back-barrier region 112 in the example of FIG. 1 should be kept above 100 nM, in the example of FIG. 2, the thickness of the buffer region 110 can be reduced below 100 nM without detrimentally impacting device performance, due to the design of the graded back-barrier region 212. According to one embodiment, the buffer region 110 is a 75 nm thick layer of gallium nitride, the first back-barrier region 202 is a layer of aluminum gallium nitride that is at least 125 nm thick), and the second back-barrier region 204 is a layer of aluminum gallium nitride that is at least 125 nm thick. More generally, these values can be tailored depending on the properties of the transition layer and reliability results. According to an embodiment, the first back-barrier region 202 has an aluminum concentration in the range of 1 to 2 percent, and more particularly about 1.5 percent and the second back barrier region 204 has an aluminum concentration in the range of 3.5 percent to 5 percent. More generally, the first back-barrier region 202 can have an aluminum concentration of less than 5 percent and the second back barrier region 204 has an aluminum concentration in the range of greater than four percent. This configuration produces a back-barrier region 212 that is spaced closely (i.e., below 100 nm) to the 2DEG and thus enhances the threshold voltage and drain-source leakage in the manner previously described. However, the drawbacks associated with the back-barrier design described with reference to FIG. 1 are alleviated. Because the second two-dimensional charge carrier gas region 206 can be mostly or completely depleted of holes, it does not significantly influence the 2DEG and therefore does not significantly impact device reliability. Meanwhile, the third two-dimensional charge carrier gas region 208 is separated from the 2DEG by both of the buffer region 110 and the first back-barrier region 202, and is therefore spaced substantially far enough so as to minimize the influence of the parasitic 2DHG on the 2DEG.

In the above example in which the buffer region 110 is a 75 nm thick layer of gallium nitride, the first back-barrier region 202 is a layer of aluminum gallium nitride that is at least 125 nm thick, the parasitic 2DHG is approximately 200 nm away from the 2DEG and thus exerts minimal influence on the 2DEG. Optionally, this distance can be further increased to 0.5-1.0 μm, for example, by increasing the thickness of the first back-barrier region 202 without compromising the benefits of the back-barrier region 112. Accordingly, the third two-dimensional charge carrier gas region 208 can be spaced far away from the first two-dimensional charge carrier gas region 118 and thus exert minimal influence over the reliability of the device.

The first and second back-barrier regions 202, 204 can be formed according to the epitaxial process described with reference to FIG. 1. The parameters (e.g., thickness and metallic content) of the first and second back-barrier regions 202, 204 can be adjusted by appropriately tailoring the epitaxial processes in a commonly known manner.

In the above described embodiments, the buffer region 110 of the device is a layer of GaN and the barrier region 108 and back-barrier barrier regions 112, 212 include one or more layers of AlGaN. These materials are used for illustrative purposes only. More generally, any of a variety of combinations of III-V semiconductor materials can be used to provide the device concept described herein. Examples of these III-V semiconductor materials for these regions include any III-nitride based compound semiconductor material. For example, GaN may be combined with AlGaN or InGaN to form an electron gas inversion region as the channel. The compound semiconductor device 100 may have AlInN/AlN/GaN barrier/spacer/buffer layer structures. In general, the normally-off compound semiconductor transistor can be realized using any suitable III-nitride technology such as GaN that permits the formation of opposite polarity inversion regions due to piezoelectric effects. In a broad sense, the compound semiconductor transistors described herein can be formed from any binary, ternary or quaternary III-nitride compound semiconductor material where piezoelectric effects are responsible for the device concept.

The term HEMT is also commonly referred to as HFET (heterostructure field effect transistor), MODFET (modulation-doped FET) and MESFET (metal semiconductor field effect transistor). The terms HEMT, HFET, MESFET and MODFET are used interchangeably herein to refer to any III-nitride based compound semiconductor transistor incorporating a junction between two materials with different band gaps (i.e., a heterojunction) as the channel.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together, e.g. a connection via a metal and/or highly doped semiconductor.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:
1. A semiconductor device, comprising:
   a type III-V semiconductor body comprising a main surface and a rear surface opposite the main surface;
   a barrier region beneath the main surface;
   a buffer region beneath the barrier region, the buffer region having material with a different band gap than material of the barrier region so as to form a first two-dimensional charge carrier gas region near an interface between the barrier region and the buffer region;

a first back-barrier region beneath the buffer region, the first back-barrier region being a type III-V semiconductor region with a different band gap than the buffer region so as to form a second two-dimensional charge carrier gas region near an interface between the buffer region and the first back-barrier region; and a second back-barrier region beneath the first back-barrier region, the second back-barrier region being a type III-V semiconductor region with a different band gap than the first back-barrier region so as to form a third two-dimensional charge carrier gas region near an interface between the first back-barrier region and the second back-barrier region, wherein both of the second and third two-dimensional charge carrier gas regions have an opposite carrier type as the first two-dimensional charge carrier gas region, and wherein the third two-dimensional charge carrier gas region is more densely populated with charge carriers than the second two-dimensional charge carrier gas region, wherein a thickness of the buffer region is 100 nm or less, and wherein a thickness of the first back-barrier region is 125 nm or more, wherein the second back-barrier region is a type III-V semiconductor metal alloy region with a metal concentration of between approximately 5 percent and approximately 10 percent wherein the third two-dimensional charge carrier gas region is spaced apart from the first two-dimensional charge carrier gas region by at least 300 nm.

2. The semiconductor device of claim 1, wherein the first two-dimensional charge carrier gas region is populated with first conductivity type charge carriers, wherein the second two-dimensional charge carrier gas region is fully depleted, and wherein the third two-dimensional charge carrier gas region is populated with second charge conductivity type carriers, the second conductivity type being opposite the first conductivity type.

3. The semiconductor device of claim 1, wherein the buffer region is a 75 nm thick layer of gallium nitride, wherein the first back-barrier region is a layer of aluminum gallium nitride that is at least 225 nm thick, wherein the second back-barrier region is a layer of aluminum gallium nitride, and wherein the second back-barrier region has a higher aluminum content than the first back-barrier region.

4. The semiconductor device of claim 3, wherein an aluminum content of the second back-barrier region is between approximately 5 percent and approximately 10 percent, and wherein an aluminum content of the first back-barrier region is between approximately 2 percent and approximately 5 percent.

5. The semiconductor device of claim 1, wherein first two-dimensional charge carrier gas region comprises a two-dimensional electron gas, and wherein the third two-dimensional charge carrier gas region comprises a two-dimensional hole gas.

6. A transistor, comprising:
a type III-V semiconductor body comprising a main surface and a rear surface opposite the main surface;
a barrier region disposed beneath the main surface;
a buffer region disposed directly beneath the barrier region, the buffer region having material with a different band gap than material of the barrier region so as to form a first two-dimensional charge carrier gas region near an interface between the barrier region and the buffer region;

gate, source and drain electrodes disposed on the main surface, the source and drain electrodes being in ohmic contact with the first two-dimensional charge carrier gas region, the gate electrode being configured to control a conductive state of the first two-dimensional charge carrier gas region between the source and drain electrodes;

a first back-barrier region disposed directly beneath the buffer region; and a second back-barrier region disposed directly beneath the first back-barrier region, wherein the first back-barrier region and the second back-barrier region each comprise a type III-V semiconductor metal alloy, and wherein a metal concentration of the second back-barrier region is higher than in the first back-barrier region, wherein a thickness of the buffer region is 100 nm or less, and wherein a thickness of the first back-barrier region is 125 nm or more, wherein a metal concentration of the second back barrier region is between approximately 5 percent and approximately 10 percent wherein a total thickness of the buffer region and the first back-barrier region is at least 300 nm.

7. The transistor of claim 6, wherein the first back-barrier region has a different band gap than the buffer region so as to form a second two-dimensional charge carrier gas region near an interface between the buffer region and the first back-barrier region, wherein the second back-barrier region has a different band gap than the first back-barrier region so as to form a third two-dimensional charge carrier gas region near an interface between the first back-barrier region and the second back-barrier region, and wherein both of the second and third two-dimensional charge carrier gas regions have an opposite carrier type as the first two-dimensional charge carrier gas region.

8. The transistor of claim 7, wherein parameters of the the buffer region and the first and second back-barrier regions are such that the third two-dimensional charge carrier gas region is more densely populated with charge carriers than the second two-dimensional charge carrier gas region.

9. The transistor of claim 8, wherein the device parameters of the high-electron-mobility transistor are such that the second two-dimensional charge carrier gas region is fully depleted.

10. The transistor of claim 8, wherein the device parameters comprise: the thickness of the buffer region, metal concentration of the first back-barrier region, thickness of the first back-barrier region, and metal concentration of the second back-barrier region.

11. The transistor of claim 9, wherein the buffer region is a 75 nm thick layer of gallium nitride, wherein the first back-barrier region is a layer of aluminum gallium nitride that is at least 225 nm thick, wherein the second back-barrier region is a layer of aluminum gallium nitride, wherein an aluminum content of the second back-barrier region is between approximately 5 percent and approximately 10 percent, and wherein an aluminum content of the first back-barrier region is between approximately 2 percent and approximately 5 percent.

12. The transistor of claim 7, wherein first two-dimensional charge carrier gas region comprises a two-dimensional electron gas, wherein the third two-dimensional charge carrier gas region comprises a two-dimensional hole gas.

13. A method of forming a semiconductor device, comprising:
forming a type III-V semiconductor body comprising a main surface and a rear surface opposite the main surface;
forming a barrier region in the semiconductor body beneath the main surface of the type III-V semiconductor body;
forming a buffer region in the semiconductor body beneath the barrier region, the buffer region having material with a different band gap than material of the barrier region so as to form a first two-dimensional charge carrier gas region near an interface between the barrier region and the buffer region;
forming a first back-barrier region in the semiconductor body beneath the buffer region, the first back-barrier region being a type III-V semiconductor region with a different band gap than the buffer region so as to form a second two-dimensional charge carrier gas region near an interface between the buffer region and the first back-barrier region; and
forming a second back-barrier region in the semiconductor body beneath the first back-barrier region, the second back-barrier region being a type III-V semiconductor region with a different band gap than the first back-barrier region so as to form a third two-dimensional charge carrier gas region near an interface between the first back-barrier region and the second back-barrier region,
wherein both of the second and third two-dimensional charge carrier gas regions have an opposite carrier type as the first two-dimensional charge carrier gas region; and
wherein forming the type III-V semiconductor body comprises selecting parameters of the buffer region, the first back-barrier region, and the second back-barrier region such that the third two-dimensional charge carrier gas region is more densely populated with charge carriers than the second two-dimensional charge carrier gas region,
wherein a thickness of the buffer region is selected to be 100 nm or less,
wherein a thickness of the first back-barrier region is selected to be 125 nm or more,
wherein the second back-barrier region is a type III-V semiconductor metal alloy region with a metal concentration of between approximately 5 percent and approximately 10 percent wherein a total thickness of the buffer region and the first back-barrier region is at least 300 nm.

14. The method of claim 13, wherein forming the type III-V semiconductor body comprises selecting the parameters of the buffer region, the first back-barrier region, and the second back-barrier region such that the first two-dimensional charge carrier gas region is populated with first conductivity type charge carriers, the second two-dimensional charge carrier gas region is fully depleted, and the third two-dimensional charge carrier gas region is populated with second charge conductivity type carriers, the second conductivity type being opposite the first conductivity type.

15. The method of claim 14, wherein selecting the parameters of the first back-barrier region, and the second back-barrier region comprises setting a metallic concentration of the second back-barrier region to be higher than a metallic concentration of the first back-barrier region.

16. The method of claim 15, wherein the buffer region is selected to be a 75 nm thick layer of gallium nitride, wherein the first back-barrier region is selected to be a layer of aluminum gallium nitride that is at least 225 nm thick, wherein the second back-barrier region is selected to be a layer of aluminum gallium nitride, wherein an aluminum content of the second back-barrier region is selected to be between approximately 5 percent and approximately 10 percent, and wherein an aluminum content of the first back-barrier region is between approximately 2 percent and approximately 5 percent.

\* \* \* \* \*

UNITED STATES PATENT AND TRADEMARK OFFICE
CERTIFICATE OF CORRECTION

| | |
|---|---|
| PATENT NO. | : 10,636,899 B2 |
| APPLICATION NO. | : 15/352115 |
| DATED | : April 28, 2020 |
| INVENTOR(S) | : Curatola |

Page 1 of 1

It is certified that error appears in the above-identified patent and that said Letters Patent is hereby corrected as shown below:

On the Title Page

Page 2/item (56), other publications (Line 4), please change "fro" to -- for --.

In the Claims

Column 9, Line 57 (Claim 5), please change "wherein first" to -- wherein the first --.

Column 10, Line 42 (Claim 8), please change "the the" to -- the --.

Column 10, Line 66 (Claim 12), please change "wherein first" to -- wherein the first --.

Signed and Sealed this
Twenty-third Day of June, 2020

Andrei Iancu
*Director of the United States Patent and Trademark Office*